United States Patent [19]

Dennhardt et al.

[11] 4,389,156
[45] Jun. 21, 1983

[54] DEVICE FOR LIFTING, GRIPPING AND TRANSPORTING PRINTING PLATES

[75] Inventors: Werner Dennhardt, Taunusstein; Hans Heist, Wiesbaden, both of Fed. Rep. of Germany

[73] Assignee: Hoechst Aktiengesellschaft, Frankfurt am Main, Fed. Rep. of Germany

[21] Appl. No.: 298,286

[22] Filed: Sep. 1, 1981

[30] Foreign Application Priority Data

Sep. 8, 1980 [DE] Fed. Rep. of Germany ....... 3033706

[51] Int. Cl.³ .......................... G03G 21/00; B65H 5/04
[52] U.S. Cl. ................................ 414/753; 355/14 SH; 355/73; 294/104; 271/85; 271/194
[58] Field of Search .................. 294/104, 116; 271/85, 271/268; 414/416, 417, 749, 751, 753; 406/84; 355/72, 73, 14 SH

[56] References Cited

U.S. PATENT DOCUMENTS

| 2,729,042 | 1/1956 | Brook | 271/85 X |
| 2,849,234 | 8/1958 | Rowlands et al. | 271/268 |
| 3,891,204 | 6/1975 | Mager | 271/85 |
| 3,951,400 | 4/1976 | Blessing et al. | 271/85 |
| 4,006,984 | 2/1977 | Friese | 355/11 |
| 4,173,427 | 11/1979 | Beuch et al. | 414/751 |

FOREIGN PATENT DOCUMENTS

| 1260957 | 6/1966 | Fed. Rep. of Germany. |
| 1815981 | 12/1968 | Fed. Rep. of Germany. |
| 2102442 | 1/1971 | Fed. Rep. of Germany. |
| 417826 | 2/1934 | United Kingdom. |

Primary Examiner—Robert J. Spar
Assistant Examiner—Terrance L. Siemens
Attorney, Agent, or Firm—Schwartz, Jeffery, Schwaab, Mack, Blumenthal & Koch

[57] ABSTRACT

Disclosed is a device for lifting, gripping and transporting printing plates in a processing apparatus of the type in which the printing plates are fixed by suction on a processing table during processing at individual stations of the apparatus. The device comprises a lifting device, positioned below the processing table, for lifting a printing plate positioned on the table, movable in the longitudinal direction of the apparatus, and a gripping member positioned above the processing table for gripping a printing plate lifted off of the processing table by the lifting device.

9 Claims, 3 Drawing Figures

DEVICE FOR LIFTING, GRIPPING AND TRANSPORTING PRINTING PLATES

BACKGROUND OF THE INVENTION

The present invention relates to a device for lifting, gripping and transporting printing plates in a processing apparatus in which, during the processing in the individual stations, the printing plates are fixed by suction on a processing table. The device comprises a lifting device for the printing plates which is installed below the processing table and can be moved forward and backward in the longitudinal direction of the apparatus, and a gripping device which is installed above the processing table and can also be moved forward and backward in the longitudinal direction of the apparatus and by which the printing plates are taken up and transported onwardly.

The device described in U.S. Pat. No. 4,006,984 is especially suited for processing apparatuses wherein imaged printing plates, which can be directly used for printing, are prepared by electrostatically charging the printing plate, projecting the image of an original onto the printing plate, and subsequently developing, fixing and decoating the printing plate. These processing steps are carried out in the respective processing stations. In certain stations, e.g., in the exposure or developing station, the printing plate lies on a processing table which forms a chamber with a plurality of holes in its upper surface. Via a suction line, the chamber is linked with a vacuum pump. During the processing, the printing plate is firmly held in place on the processing table by the creation of a vacuum within the chamber. After completion of the respective processing step, air is introduced into the chamber, the printing plate is lifted, taken up by a gripping device and conveyed to the next processing station.

For lifting the printing plate, a lifting device installed below the processing station is used, wherein after the aeration, a pin is lifted by means of a driving means, and the plate is raised from the processing table by the pin. Before the next printing plate is transported onto the processing table, the pin is lowered again. However, the use of a special driving means, which must be controlled appropriately, makes this device very expensive and complicated. There is also the danger that, in case of a malfunctioning, the pin remains raised or cannot be lowered in time, and as a result the oncoming printing plate may be damaged.

The lifted plate is gripped and transported by means of a gripping device which can be moved forward and backward above the processing table in the longitudinal direction of the apparatus. A known gripping device has the shape of a clothespin. When this clothespin-type clamp is moved in the direction of the raised end of the printing plate, it is opened by a motor. As soon as the end of the printing plate rests in the opened clamp, the clamp is closed, and the device with the clamped-in printing plate is moved on to the next processing station. At the point where the printing plate is to be deposited again, the clamp opens. This gripping device requires complicated means for its adjustment. For opening the clamp, a driving means is needed which has to be appropriately controlled.

SUMMARY OF THE INVENTION

It is therefore an object of the present invention to provide an improved device for lifting, gripping and transporting printing plates of the type described in the introductory portion of the specification.

Another object of the present invention is to provide such a device wherein no driving means is required for lifting the printing plates and wherein the danger of damaging the plates through the lifting device is avoided.

Still another object of the invention is to provide such a device comprising a simplified gripping device where no driving means is necessary to open it.

In accomplishing the foregoing objects, there has been provided in accordance with the present invention a device for lifting, gripping and transporting printing plates in a processing apparatus of the type in which the printing plates are fixed by suction on a processing table during processing at individual stations of the apparatus, said device comprising means, positioned below the processing table, for lifting a printing plate positioned on the table, the lifting means being movable in the longitudinal direction of the apparatus; and a gripping member positioned above the processing table for gripping a printing plate lifted off of the processing table by the lifting means. In one embodiment, the lifting means comprises a lifting member having a height (h), and means, including a spring member having a compressive force insufficient to lift off of the processing table a printing plate fixed by suction but sufficient to lift the printing plate when the suction is released, for shortening the lifting member to a height less than (h) under compression of the spring member in response to movement of the lifting means in the direction of transport of the printing plate, whereas, preferably in addition, or in another embodiment, the gripping member is movable in the longitudinal direction of the apparatus and comprises a supporting surface for the printing plate, an angular clamping member pivoted at its vertex for rotation with respect to the supporting surface such that the end of a first leg of the clamping member rests on the supporting surface and an angle $\beta$ (in the direction of the printing plate to be inserted) of less than 90° is formed between the first leg and the supporting surface and such that an angle $90° - \alpha$ is formed between the first leg and an inserted printing plate, wherein the angle $\alpha$ is sufficiently small to produce a gripping of the printing plate between the supporting surface and the first leg, and means for rotating the clamping member in the direction of the inserted end of the printing plate to release the printing plate in response to movement of the gripping member to a location where release of the printing plate is desired. Preferably, the shortening means comprises an inclined bearing surface rising in the direction of transport of the printing plate, the bearing surface being positioned so that, at the beginning of the incline, the surface is positioned at a distance greater than (h) from the printing plate and, at the upper end of the incline, the surface is positioned at a distance smaller than (h) from the printing plate, and at least one pin member capable of telescopically collapsing as part of the lifting member against the compressive force of the spring member.

Further objects, features and advantages of the invention will become apparent from the detailed description of preferred embodiments which follows, when considered together with the attached figures of drawing.

DETAILED DESCRIPTION OF PREFERRED EMBODIMENTS

Figure 1:
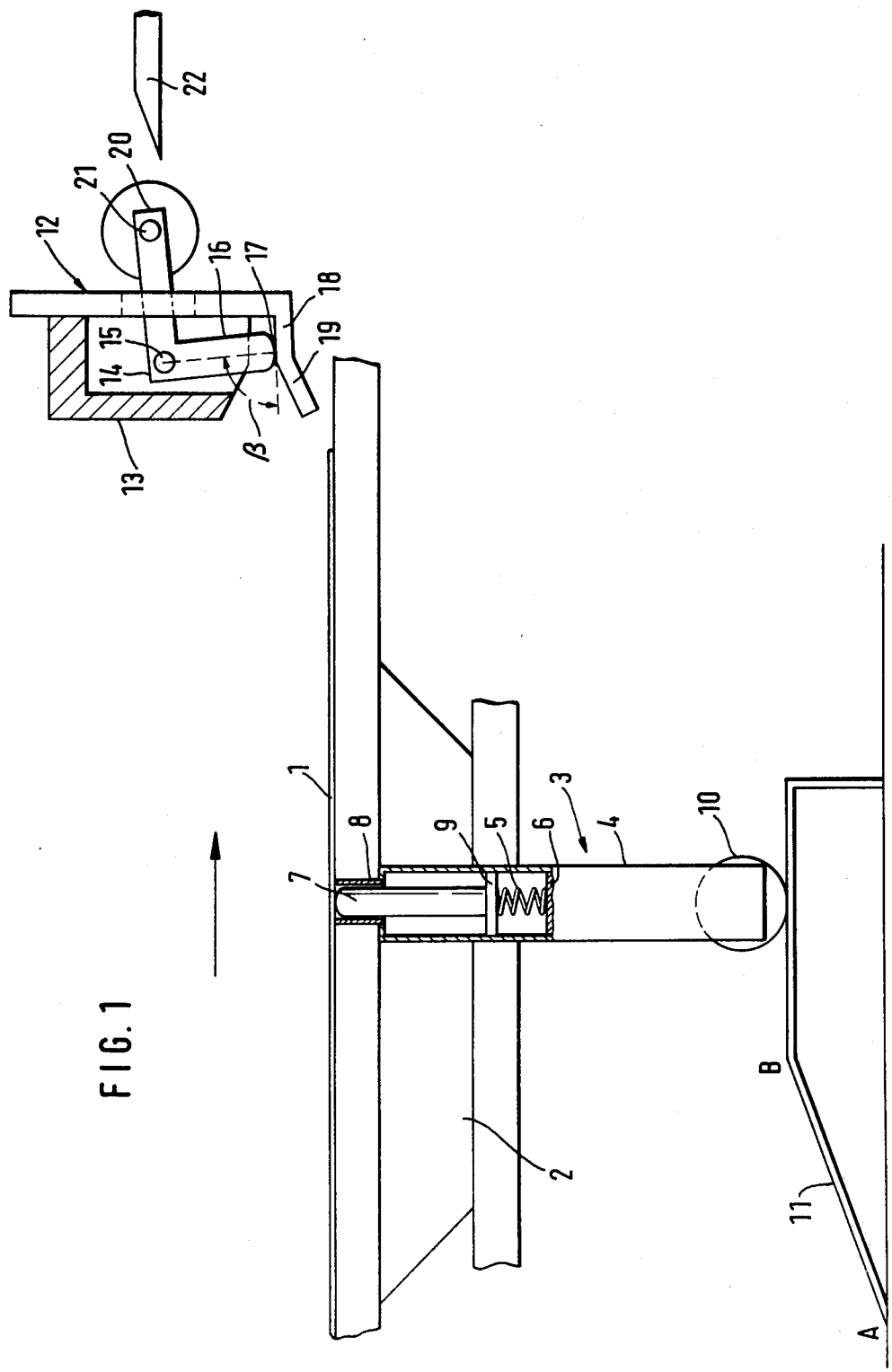
FIG. 1 is a longitudinal plan view of a device according to the invention, with the printing plate held on by suction.

Due to the fact that the sliding surface for the lifting device rises in the direction of transport of the printing plate, no special driving means is necessary for lifting the printing plate. The lifting device is equipped with a pin which can glide back into the lifting device, against the pressure of a spring. By the sliding surface it is further ensured that during the return movement of the lifting device the pin is lowered down to a level where any damaging of the plate is excluded.

Preferably, the lifting device is firmly attached to the processing table, which itself can be moved in the longitudinal direction of the apparatus.

The gripping device essentially comprises a support for the printing plate and a clamping angle which is pivoted at its vertex and one end of which rests on the support for the printing plate. The clamping leg of the clamping angle is inclined in the direction of the printing plate to be gripped. Thereby an easy insertion of the plate end between the support and the clamping leg is guaranteed when the gripping device is moved in the direction of the printing plate. The clamping leg and the inserted printing plate form an angle of $90° - \alpha$. The angle $\alpha$ is chosen as small as possible and is equal to or smaller than a limiting angle $\alpha_o$ which is determined by the relation given below.

When the movement of the gripping device in the direction of transport is initiated, there is a short moment of a relative movement between the printing plate and the gripping device, whereby the clamping angle is slightly rotated in the clockwise direction. By this rotary movement, the printing plate is clamped between the support and the clamping leg, so that the relative movement is stopped, and the printing plate is moved together with the gripping device in the direction of transport. The above-mentioned requirement that the angle $\alpha$ not be greater than the limiting angle $\alpha_o$ ensures that the friction between the printing plate and the gripping device is sufficiently high to move the clamping angle into its clamping position and to prevent the printing plate from slipping out of the gripping device.

Once the clamping action has started, the printing plate cannot be released again except by turning the clamping leg in the counter-clockwise direction. For this reason, there is provided in the path of motion of the gripping device a bevelled leading surface for the second end of the clamping angle, at the point where the printing plate is to be released. Upon reaching the bevelled leading surface, this end of the gripping device is raised, and the clamping angle is rotated counter-clockwise about its axle, whereby the printing plate is released and falls out of the gripping device.

In this gripping device, no special driving means is required to open the gripping device for inserting and releasing the printing plate. Nevertheless the printing plate is firmly held and can be conveyed to the next processing station.

The invention shall now be explained in more detail by way of the attached figures of drawing. The following description of the device according to the present invention is given by reference to an exemplary embodiment of the device positioned in the developing station.

In FIG. 1, the printing plate 1 lies on the developing table 2, to which a vacuum is applied, so that the plate 1 is retained on the table 2. The lifting device 3 is firmly attached to the developing table 2 and therefore can be moved forward and backward in the longitudinal direction of the apparatus by the driving mechanism of the developing table 2, together with the latter. The driving mechanism is not shown in the drawing.

In a casing 4, the lifting device 3 comprises a spring 5 which is supported by an end support 6. The spring force has been chosen such that it is high enough to raise the printing plate 1 when the developing table 2 is aerated, but such that, on the other hand, it is low enough to avoid any damaging by the pin 7 of the printing plate 1 held onto the table by suction.

Figure 2:
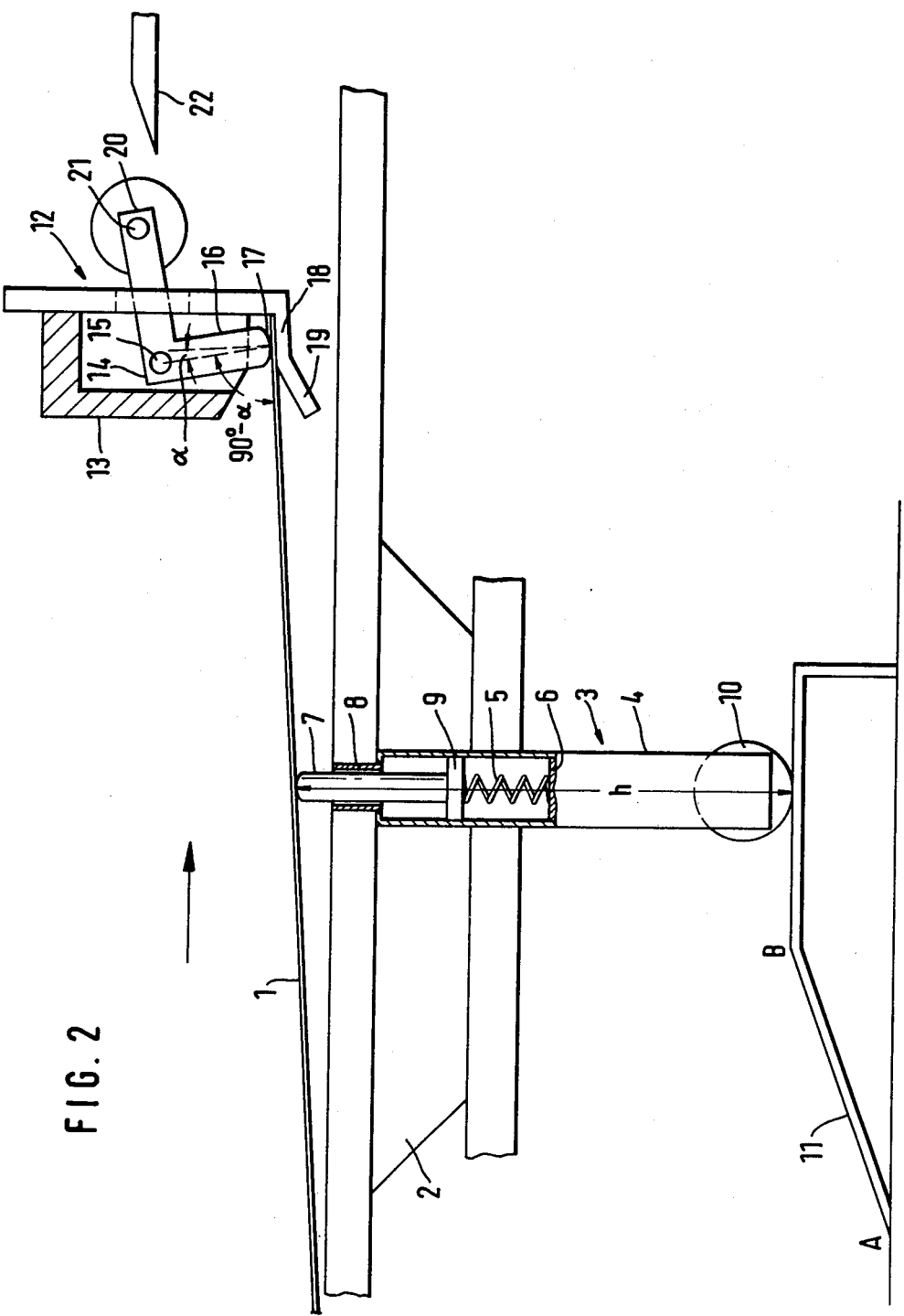
FIG. 2 is a longitudinal plan view of a device according to the invention, with the printing plate being lifted and inserted into the gripping device.

At the upper end of the lifting device 3, there are two pins 7, for which guide sleeves 8 are provided. The pins 7 are fastened on a rail 9, which is arranged transversely to the longitudinal direction of the printing plate, in the lifting direction, and rests on the spring 5. When pressure is exerted onto the pins 7, they are pushed into the lifting device 3 and the rail 9 is simultaneously pushed downwardly, whereby the spring 5 is loaded. The loaded position is shown in FIG. 1, whereas FIG. 2 shows the spring in its unloaded position.

At the lower end of the gripping device 3, there are rollers 10, which make it possible for the lifting device 3 to glide on the inclined sliding surface 11 rising in the direction of transport of the printing plate 1 (indicated by the arrow), simultaneously with the movement of the developing table 2 in the longitudinal direction of the apparatus. At the beginning A of the rise, the distance between the sliding surface 11 and the printing plate 1 held onto the developing table 2 by suction is greater than the height h of the lifting device 3 in the unloaded state, i.e., when no pressure is exerted onto the pins 7, whereas at the upper end B of the rise, this distance is smaller than the height h of the lifting device 3.

The developing table 2 with the printing plate 1 held on by suction is initially in a position shifted toward the left compared with the position shown in FIG. 1. The lifting device 3 then is positioned before the rising sliding surface 11, i.e., it is unloaded. When the developing table 2 is moved in the direction of transport of the printing plate 1 (arrow), the lifting device 3 rolls up the sliding surface 11. The printing plate 1 held on by suction now presses against the pins 7 which together with the rail 9 are pushed down and thus load the spring 5 (see FIG. 1). Upon the aeration of the developing table 2, the rail 9 and the pins 7 are pushed upwardly by the spring 5, and the printing plate 1 is lifted to the position shown in FIG. 2. Thereupon, the gripping device 12, which so far was positioned out of the range of the printing plate 1 (see FIG. 1), is moved in the direction of the printing plate 1, by a driving means not shown in the drawing, until the end of the printing plate 1 is inserted into the gripping device 12 (see FIG. 2).

The gripping device 12 is installed in the apparatus such that it can be moved forward and backward in the longitudinal direction. It comprises a housing wherein a clamping angle 14 is pivoted on an axle 15 which is mounted at the vertex of the clamping angle 14. One end 17 of the clamping leg 16 rests on a support 18 for the printing plate 1, with the dead weight of the clamping angle 14. A leading rail 19, which is directed downwardly, is provided on the support facing the end of the printing plate 1. The support 18 preferably has the same inclination as the end to be gripped of the lifted printing plate 1. In the direction of the printing plate 1 to be inserted, the clamping leg 16 and the support 18 form an angle $\beta$ which is smaller than 90°, even before the printing plate is inserted. This provides for an easy insertion of the printing plate 1. At the other end 20 of the clamping angle 14, there is mounted a laterally projecting pin 21. At the point where the printing plate 1 is to be released from the gripping device 12, there is provided a bevelled leading surface 22 for the pin 21 of the clamping angle 14.

When the end of the printing plate 1 is inserted into the gripping device 12, the clamping leg 16 and the printing plate 1 form an angle of $90° - \alpha$ This angle is slightly smaller than the angle $\beta$ mentioned above, which is formed by the clamping leg 16 and the support 18, since the printing plate 1 has a certain thickness, and therefore the clamping angle 14 is rotated about the axle 15 in the counter-clockwise direction when the printing plate 1 is inserted, by an amount depending on the thickness of the printing plate 1. In order to obtain a good clamping action, it is advisable to choose the angle $\alpha$ as small as possible. When the movement of the gripping device 12 in the direction of the transport is started, there is first a relative movement between the printing plate 1 and the gripping device 12, until the clamping leg 16 has been slightly turned in the clockwise direction and the clamping position has been reached. During this phase, i.e., before the clamping position has been reached, a frictional force is required which is high enough to prevent the printing plate 1 from slipping out of the gripping device 12. The greater the coefficient of friction $\mu$ is, the greater is this frictional force. The angle $\alpha$ must be equal to or smaller than the limiting angle $\alpha_o$ which is deduced by reference to FIG. 3.

Figure 3:
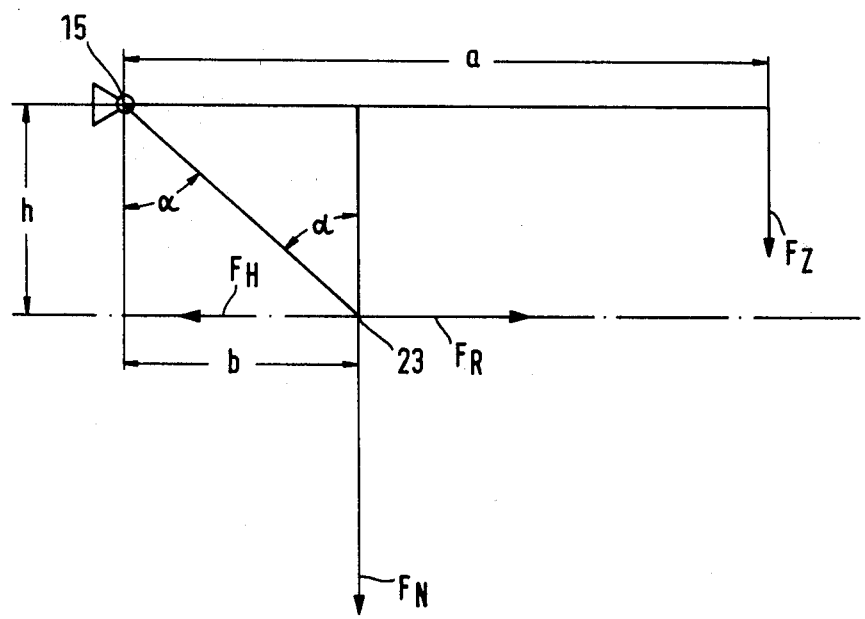
FIG. 3 is a diagram illustrating the forces acting in the gripping device for determining the limiting angle $a_o$.

In FIG. 3, the reference numeral 23 indicates the contact point between the printing plate 1 and the end 17 of the clamping leg 16. $F_Z$ means the force given by the weight of the clamping angle 14. $F_N$ means the force exerted onto the printing plate 1 by the clamping leg 16 at the contact point 23. $F_H$ is the tractive force determined by the force $F_D$ (not shown), which depends on the dead weight of the printing plate and on the coefficient of friction, and acts against the frictional force $F_R$, which in turn depends on the coefficient of friction and $F_N$.

$$F_H = F_D \times \mu \quad (1)$$

$$F_R = F_N \times \mu \quad (2)$$

In order to prevent the printing plate from slipping out of the gripping device 12 before being firmly clamped between the clamping leg 16 and the support 18, there must be:

$$F_R \geqq F_H$$

The following relations can be deduced from FIG. 3:

$$F_Z \times a = F_N \times b \quad (3)$$

$$b = h \times \tan \alpha \quad (4)$$

When the equations (4) and (2) are put into equation (3), the following results:

$$F_Z \times a = (F_R/\mu) \times h \times \tan \alpha \quad (5)$$

As to the limiting angle $\alpha_o$, what follows therefrom is:

$$\tan \alpha_o = \frac{F_Z \times a}{F_R \times h} \times \mu \quad (6)$$

whereby $(F_Z \times a)/h$ has a defined value for the limit angle $\alpha_o$, which is designated C. Thus one obtains:

$$\tan \alpha_o = (C/F_R) \times \mu \quad (7)$$

In case of a known coefficient of friction $\mu$, it can therefore be stated:

$$\tan \alpha_o = (C/F_R) \times \mu \quad (8)$$

or $$F_R = (C \times \mu)/\tan \alpha_o$$

This means that the frictional force increases when $\alpha$ is smaller than $\alpha_o$.

By means of the gripping device 12, the printing plate 1, which is clamped between the support 18 and the clamping leg 16, is moved in the direction of transport until the pin 21 at the clamping angle 14 runs on the bevelled leading surface 22. The pin 21 is raised by the bevelled leading surface 22, which causes the clamping angle 14 to rotate about the axle 15 in the counter-clockwise direction. In this way, the gripping device 12 is opened and the printing plate 1 slips out of the gripping device 12, while the latter continues to move up the bevelled leading surface 22.

The foregoing description of the preferred embodiments of the invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A device for lifting, gripping and transporting printing plates in a processing apparatus of the type in which the printing plates are fixed by suction on a processing table during processing at individual stations of the apparatus, said device comprising:

means, positioned below the processing table, for lifting a printing plate positioned on the table, said lifting means being movable in the longitudinal direction of the apparatus and comprising a lifting member having a height (h), and means, including a spring member having a compressive force insufficient to lift off of the processing table a printing plate fixed by suction but sufficient to lift the printing plate when the suction is released, for shortening said lifting member to a height less than (h) under compression of said spring member in response to movement of said lifting means in the direction of transport of the printing plate; and a gripping member positioned above the processing table for gripping a printing plate lifted off of the processing table by said lifting means.

2. A device as claimed in claim 1, wherein said shortening means comprises an inclined bearing surface rising in the direction of transport of the printing plate, said bearing surface being positioned so that, at the beginning of the incline, the surface is positioned at a distance greater than (h) from the printing plate and, at the upper end of the incline, the surface is positioned at a distance smaller than (h) from the printing plate, and at least one pin member capable of telescopically collapsing as part of said lifting member against the compressive force of said spring member.

3. A device as claimed in claim 2, wherein said lifting means includes a rail member positioned transversely to the longitudinal direction of the printing plate, and two pin members positioned on the top of said rail member, said rail member moving in the direction of the spring member when pressure is exerted on said pin members.

4. A device as claimed in claim 1, 2 or 3, wherein said lifting means is firmly attached to the processing table and said processing table is movable in the longitudinal direction of the apparatus.

5. A device as claimed in claim 1, wherein said gripping member is movable in the longitudinal direction of the apparatus and comprises a supporting surface for the printing plate, an angular clamping member pivoted at its vertex for rotation with respect to said supporting surface such that the end of a first leg of said clamping member rests on said supporting surface and an angle $\beta$ (in the direction of the printing plate to be inserted) of less than 90° is formed between said first leg and said supporting surface and such that an angle $90° - \alpha$ is formed between said first leg and an inserted printing plate, wherein the angle $\alpha$ is sufficiently small to produce a gripping of the printing plate between said supporting surface and said first leg, and means for rotating said clamping member in the direction of the inserted end of the printed plate to release the printing plate in response to movement of said gripping member to a location where release of the printing plate is desired.

6. A device as claimed in claim 5, wherein said rotating means comprises a camming surface positioned for engagement by a cam follower associated with the second leg of said clamping member.

7. A device for lifting, gripping and transporting printing plates in a processing apparatus of the type in which the printing plates are fixed by suction on a processing table during processing at individual stations of the apparatus, said device comprising:

means, positioned below the processing table, for lifting a printing plate positioned on the table, said lifting means being movable in the longitudinal direction of the apparatus; and a gripping member positioned above the processing table for gripping a printing plate lifted off of the processing table by said lifting means, said gripping member being movable in the longitudinal direction of the apparatus and comprising a supporting surface for the printing plate, an angular clamping member pivoted at its vertex for rotation with respect to said supporting surface such that the end of a first leg of said clamping member rests on said supporting surface and an angle $\beta$ (in the direction of the printing plate to be inserted) of less than 90° is formed between said first leg and said supporting surface and such that an angle $90° - \alpha$ is formed between said first leg and an inserted printing plate, wherein the angle $\alpha$ is sufficiently small to produce a gripping of the printing plate between said supporting surface and said first leg, and means, comprising a camming surface positioned for engagement by a cam follower associated with a second leg of said clamping member, for rotating said clamping member in the direction of the inserted end of the printed plate to release the printed plate in response to movement of said gripping member to a location where release of the printing plate is desired wherein said cam follower comprises a pin attached to said second leg and said camming surface comprises an inclined surface.

8. A device as claimed in claim 7, wherein said supporting surface has the same inclination as the end to be gripped of the lifted printing plate.

9. A device as claimed in claim 8, wherein, in the direction of the printing plate to be gripped, said supporting surface is provided with a guide portion being inclined downwardly.

* * * * *